United States Patent [19]

Chasson et al.

[11] 4,216,466
[45] Aug. 5, 1980

[54] DIGITAL TO SYNCHRO CONVERTER

[75] Inventors: Louis Chasson, Valence; Raymond Euvrard, Bourg les Valence; Paul Romand, Bourg de Peage, all of France

[73] Assignee: Crouzet, Paris, France

[21] Appl. No.: 969,215

[22] Filed: Dec. 13, 1978

Related U.S. Application Data

[63] Continuation-in-part of Ser. No. 775,327, Mar. 7, 1977, abandoned.

[30] Foreign Application Priority Data

Mar. 15, 1976 [FR] France .................................. 76 07620

[51] Int. Cl.² ............................................. H03K 13/02
[52] U.S. Cl. ................................ 340/347 SY; 318/605
[58] Field of Search ................. 340/347 DA, 347 SY, 340/347 M; 318/604, 605, 661

[56]  References Cited

U.S. PATENT DOCUMENTS

| 2,950,427 | 8/1960 | Tripp | 318/605 |
| 3,175,138 | 3/1965 | Kilroy | 318/605 |
| 3,870,938 | 3/1975 | Tooze | 318/605 |

*Primary Examiner*—Charles D. Miller
*Attorney, Agent, or Firm*—Holman & Stern

[57] ABSTRACT

This disclosure describes a device for converting binary coded angle information into the analog angular position of the rotor winding of a conventional counter-reaction resolver. The device is operative to provide two periodic rectangular wave signals of equal amplitudes and of time durations respectively proportional to the absolute values of the sine and cosine of the angle. These periodic rectangular wave signals are respectively applied to the stator windings of the resolver via two amplifiers respectively. Each of these amplifiers comprises a counter-reaction loop comprising a compensation winding and a capacitor. The rotor winding of the resolver is inserted in a servocontrol loop comprising an amplifier and a commutator which are connected only in the simultaneous absence of the two periodical rectangular wave signals.

7 Claims, 6 Drawing Figures

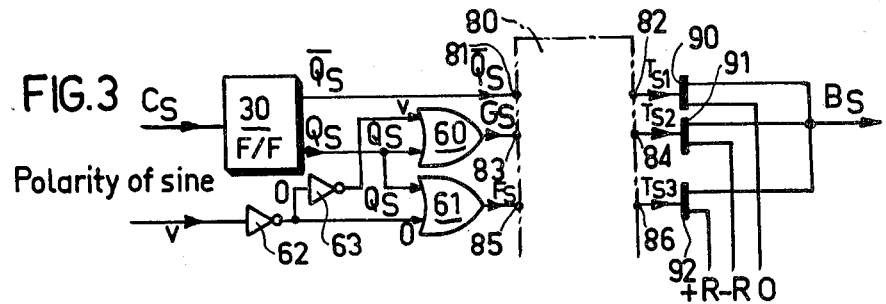

DIGITAL TO SYNCHRO CONVERTER

This application is a continuation-in-part of application Ser. No. 775,327, filed Mar. 7, 1977 and now abandoned.

BACKGROUND OF THE INVENTION

The present invention relates to a device for converting into analog form a digital information signal constituted by binary numbers representative of the sine and cosine trigonometric components by a variable angle, and to the display in analog form, particularly by the rotation of a needle on a dial, of this angular information provided by a digital computer. This is a conventional problem in the aeronautical equipment industry, the computer is question being an air navigation computer of the type employed on board an aircraft.

Two solutions of this type of problem are presently known, depending on whether the digital information to be converted is of angular or trigonometric nature.

When the information is angular, the conversion is made either by using a servo-controlled coder in which the angular position is determined by the cancellation of the error signal supplied by a digital comparator, or by using a servo-controlled potentiometer in which the angular position is determined by reproducing the analog signal obtained after decoding of the digital information.

When the information is trigonometric, two of the binary numbers are decoded and converted into positive or negative D.C. voltages of amplitudes respectively equal to the sine and cosine values of the angle. These voltages are then memorized to be finally used to supply a resolver of potentiometric or, preferably, electromagnetic nature. In the latter case, it is necessary to modulate the two D.C. voltages to obtain two A.C. voltages, having an amplitude ratio equal to that of the two D.C. voltages, and having relative phases which are representative of the signs of the sine and cosine. These A.C voltages are then applied to the two stator windings of the resolver, which may be provided with a compensation winding, so that the voltage induced on the rotor of the resolver, after amplification, controls a servomotor. The servomotor orients the rotor until the voltage induced on the rotor is cancelled, thus determining, upon stoppage of the motor, an angular position (relative to a predetermined starting position) on the axis of the rotor, thereby representing the angle which it is desired to display.

Insofar as it is desired to obtain an acceptable degree of accuracy and reliability in carrying out decoding, memorising and modulation operations, considerable production difficulties are encountered, from the technological standpoint, which have repercussions on the weight and cost of the device.

SUMMARY OF THE INVENTION

It is an object of the present invention to remedy these drawbacks by providing a device enabling this conversion to be carried out with a highly satisfactory degree of accuracy and reliability, whilst using simple, ordinary and inexpensive technological components.

It is also an object of the present invention, whilst using a conventional counter-reaction resolver, to apply to the stator windings of this resolver signals which are modulated in time duration and not in amplitude, the technology carried out to this end being much simpler.

The invention will be more readily understood on reading the following description with reference to the accompanying drawings.

BRIEF DESCRIPTION OF THE DRAWING

FIG. 3 shows a block diagram of the part of the device of FIG. 1 for amplitude calibration and introduction of the sign information;

DETAILED DESCRIPTION OF THE PREFERRED EMBODIMENT

Figure 1:
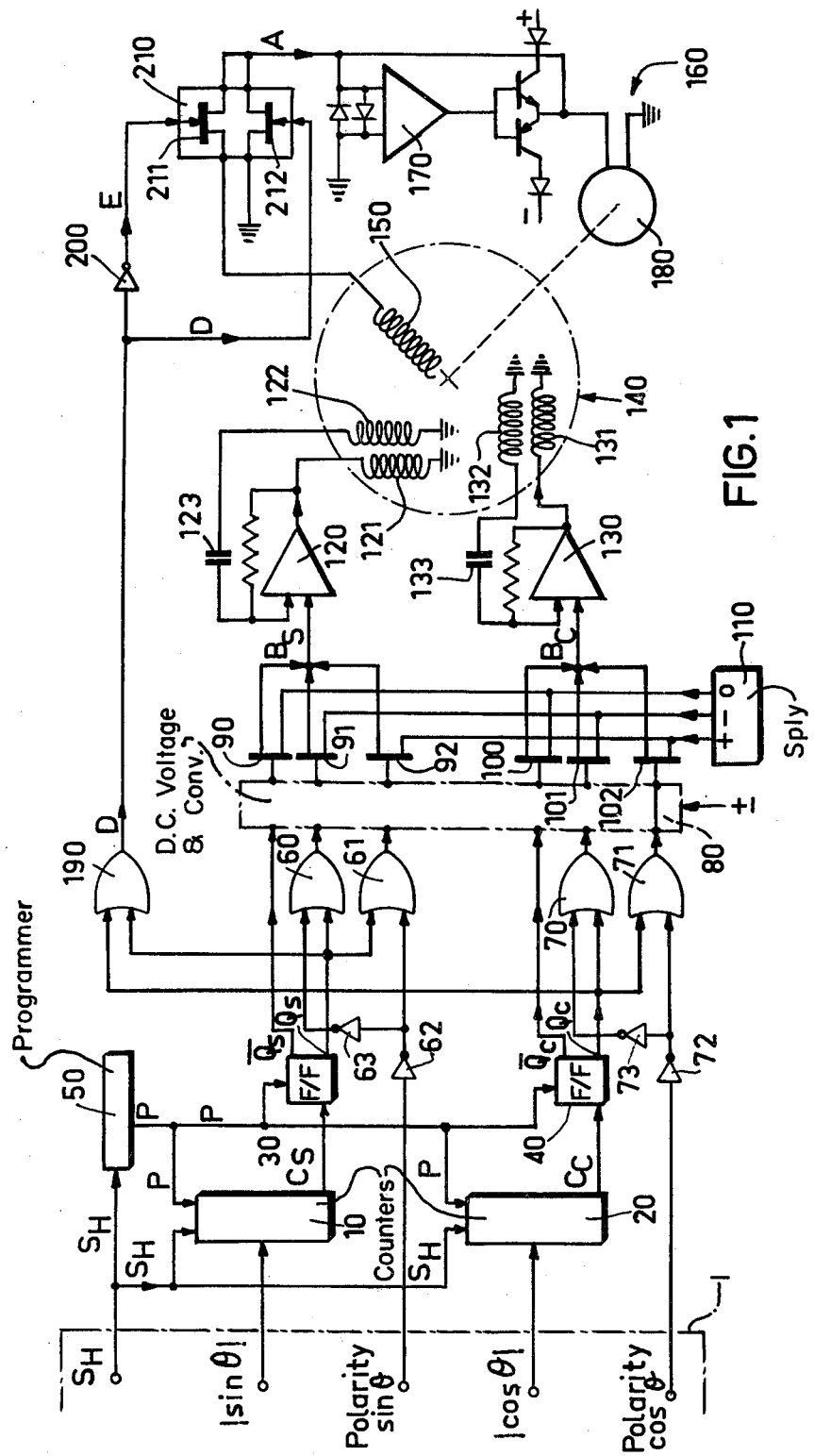
FIG. 1 shows a block diagram of the device of the invention.

Referring now to the drawing, the conversion device of the invention, shown in FIG. 1 in a block diagram, is intended for converting into analog form a digital information signal, constituted by two numbers representing the absolute values of the sine and cosine trigonometric components of a variable angle and by two other numbers representing the signs of these trigonometric components. These members are supplied by an air navigation computer 1, of the type employed on board an aircraft.

These numbers may be expressed in any code; however, the natural binary code is preferred, with a given number of bits, representing the absolute values of the sine and cosine, and a single bit (0 or 1), representing the signs of the sine and cosine, respectively, available in output registers (not shown) of the computer 1.

As will be seen hereinafter, a reference signal is necessary and, to this end, the clock signal (not shown) provided by computer 1 is preferably used.

The device of the invention first effects the conversion of the binary numbers representative of the absolute values of the trigonometric components of the angle into periodic signals modulated in time duration.

This conversion is carried out by two counters 10 and 20, one for the sine channel and one for the cosine channel, two flip-flops 30 and 40 associated respectively with the two counters 10 and 20, and a programming means 50.

Let us consider one of the two sine and cosine channels, for example the sine channel, the cosine channel being identical.

The counter 10 is a binary counter, constituted by a series of binary flip-flops in such number that the combined states of these flip-flops represents a binary number comprising as many bits as the corresponding output register of the computer mentioned hereinabove. In other words, the capacities of the counter 10 and the register associated therewith are equal.

Figure 2:
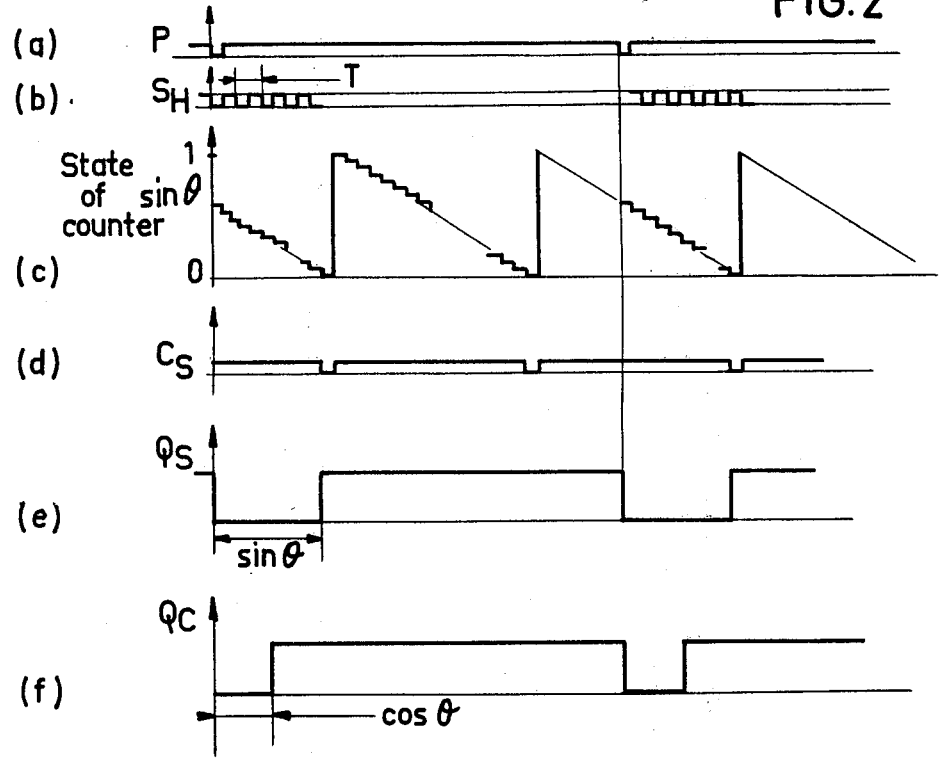
FIGS. 2($a$–$b$) show a timing chart showing the various signals appearing in the count down part of the device of FIG. 1.

The flip-flops of the counter 10 are conventionally organised as a countdown system and such that the counter 10 delivers an output signal or pulse Cs upon each of its zero crossings (FIG. 2$d$).

The clock signal $S_H$ (FIG. 2$b$), represented by a series of rectangular pulses of period T, is applied to the input of the counter 10. Thus, the counter successively assumes states (FIG. 2c) respectively representing binary numbers which decrease by one unit at each clock pulse, until the number passes through zero, after which it takes a state representing the highest binary number (corresponding to the decimal number 1 since the function is sine or cosine).

The programming means 50 provides an output signal P which is composed of a series of pulses (FIG. 2a) and is applied to the input of the counter 10. Each of these pulses forces the counter 10 to take the state corresponding to the absolute value of the sine of angle $\theta$, from which state the clock causes the counter to count down unit by unit. Upon the appearance of each of the pulses of signal P, the contents of the register in question of the computer 1 are instantaneously transferred, bit by bit, into the counter 10, having inputs connected to the corresponding outputs of the register. The time which passes between the moment when the counter 10 is forced by the programming means 50 and the moment when the counter 10 passes through zero and emits a pulse, is proportional to sin $\theta$.

The flip-flop 30, known per se, may take a high state and a low state. It is precisely controlled by the output signal P of the programming means 50 to assume its low state, and by the output signal Cs of the counter 10 to return its high state again. The output signal Qs of the flip-flop 30, shown in FIG. 2e, is therefore a rectangular wave periodic signal modulated in time duration (i.e. pulse width), the duration of the low state being proportional to sin $\theta$.

It should be noted that the pulses of the output signal Cs of the counter 10 do not act on the flip-flop 30 as long as a pulse of the output signal P of the programming means 50 has not inverted the state of this flip-flop.

FIG. 2f shows the output signal Qc of the flip flop 40 of the consine channel, generated in the same way as the signal Qs of the sine channel.

The recurrence frequency of the pulses of output signal P of the programming means 50 is preferably close to 400 Hz. In addition, the maximum duration of the low state of the output signals Qs and Qc of flip-flops 30 and 40, corresponding to sin $\theta$ or cos $\theta$ equal to 1, must be clearly shorter than the period of recurrence of the pulses of signal P. If, for example, the capacity of the registers of the computer 1 and the counters 10 and 20 is eight bits, corresponding to 256 countdown states, it is deduced therefrom that 256 T, the maximum duration of a low state, must be clearly shorter than 1/400 s. T being the period of the clock, its frequency must therefore be clearly greater than 102, 400 Hz. In the case of the maximum duration of a low state being half the period of recurrence of signal P, the clock frequency is equal to 204.8 kHz. In any case, the invention is not limited by the clock frequency of the computer because a frequency close to 400 Hz can always be generated from any clock frequency. In the embodiment described and shown, the maximum duration of a low state is effectively equal to one half of the recurrence period, and the programming means 50 is a simple frequency divider receiving, at its input, the signal of the clock of the computer.

The rectangular periodic signals Qs and Qc, modulated in time duration, do not have very precise amplitudes and do not contain the sign informations of the respective trigonometric components.

The device of the invention therefore then generates rectangular waveform periodic signals of the same time durations (i.e. pulse widths) as the signals Qs and Qc, but of amplitudes defined with accuracy and containing the sign informations.

This new conversion is effected by two sets of two logic OR gates 60, 61 and 70, 71 (one for the sine channel and one for the cosine channel), two sets of two inverters 62, 63 and 72, 73 (one for the sine channel and one for the cosine channel), an adapter, or D.C. voltage convertor, 80, known per se, two sets of three analog switches 90, 91, 92 and 100, 101, 102, each switch being constituted by a field effect transistor (FET), and a reference supply 110.

The supply 110 is a generator of stabilized and calibrated voltages delivering the D.C. reference voltages O, +R and −R, each set of FETs acting as a conventional commutator. The commutator, according to its position, defined by the sign of the trigonometric component in question and the duration of the low state of the output signal of the corresponding flip-flop 30, 40, makes it possible to deliver into the channel in question one of the above three reference signals.

In fact, each FET 90–92 and 100–102 is a solid state switch which is closed when its control electrode is at a given potential V (the transistor is "on") and open when its control electrode is at a potential −V (the transistor is "off").

At this point of the description, it should be noted that the two flip-flops 30 and 40 are arranged to deliver, along with the output signals Qs and Qc, their complementary signals $\overline{Q}s$ and $\overline{Q}c$, respectively.

Reference is not made to FIG. 3 which shows the diagram of the portion of the device of the invention which effects this new conversion on the sine channel, the portion corresponding to the cosine channel being identical.

The inverters 62 and 63, known per se, convert a logic signal v into an inverse or complementary logic signal o, and a logic signal o into an inverse logic signal v.

The adapter 80, known per se, and essentially comprising solid state switches ensuring voltage commutations, receives two supply voltages +V and −V, so that the relationship established between an output of the adapter 80 and the corresponding input is expressed in one of the following two ways:

| input | output |
|-------|--------|
| o     | +V     |
| v     | −V     |

Let us now consider the output signal Bs delivered by the set of FETs 90–92, assuming that the sign of sin $\theta$ is positive, i.e. the computer 1 supplies a continuous sign signal, for example v, corresponding to bit 1, which is applied to the input of the inverter 62.

With reference to FIG. 3, the output signal $\overline{Q}s$ is applied to a first input 81 of the adapter 80, corresponding to a first output 82 delivering a signal Ts1 to the control electrode of transistor 90. The output signal Qs is applied to one of the inputs of the OR gate 60 and to one of the inputs of the OR gate 61. The sign signal v is applied, after inversion in the inverter 62, to the other input of the OR gate 61 and, after double inversion in the inverters 62 and 63, to the other input of the OR gate 60. The output signal Gs of the OR gate 60 is applied to a second input 83 of the adapter 80, corresponding to a second output 84 delivering a signal Ts2 to the control electrode of the transistor 91. The output signal Fs of the OR gate 61 is applied to a third input 85 of the adapter 80, corresponding to a third output 86 delivering a signal Ts3 to the control electrode of the transistor 92.

Figure 4:
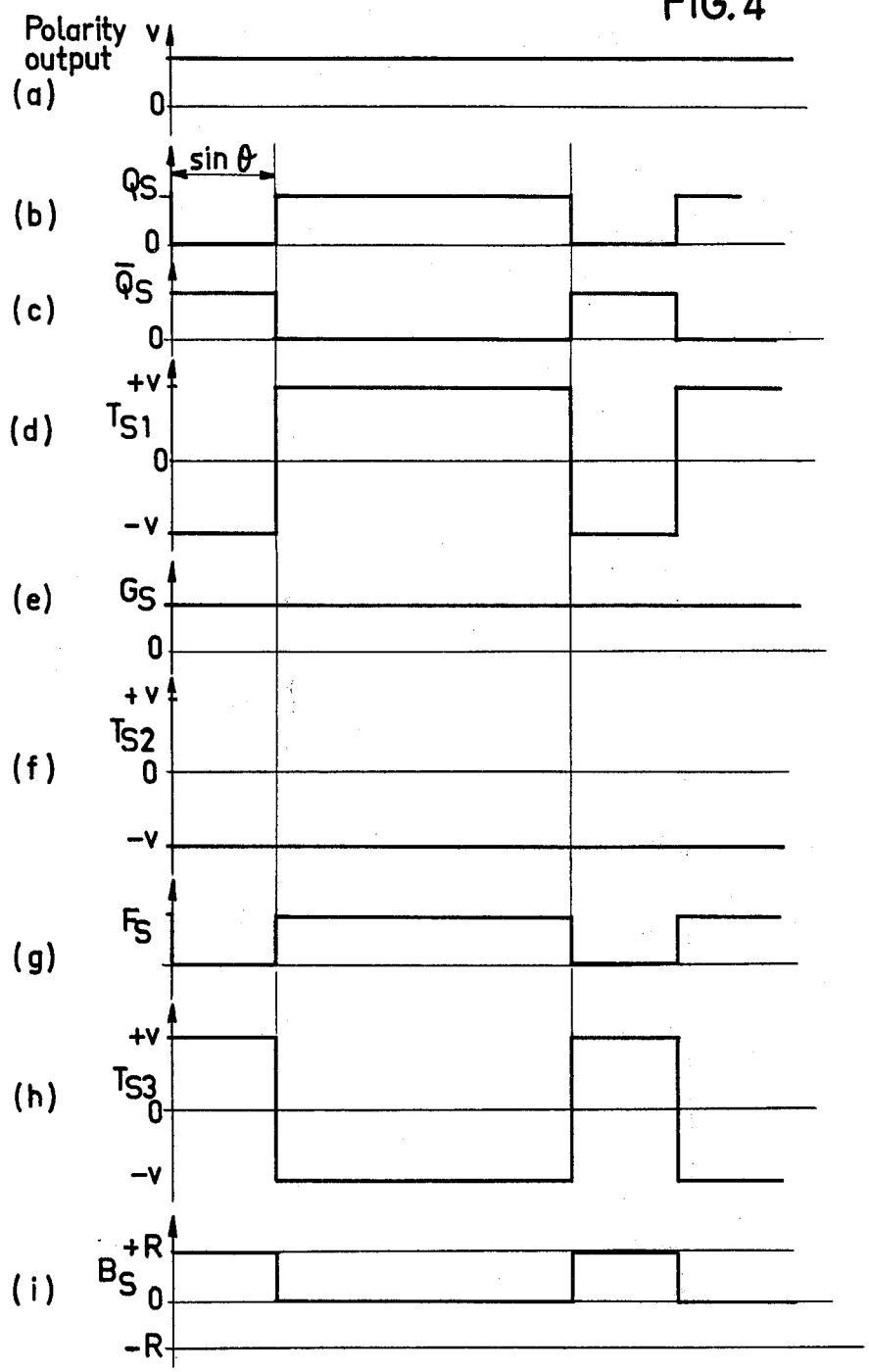
FIGS. 4 ($a$–$i$) and 5($a$–$i$) show a timing chart representing the various signals appearing in the part of the device of FIG. 1 converting the periodic signals modulated in time duration of FIG. 3 into pure periodic signals, and FIGS. 6 ($a$–$e$) show a timing chart representing the various signals appearing in the servocontrol loop of the device of FIG. 1.

FIG. 4 shows the signals v, Qs, $\overline{Q}s$, Gs, Fs, Ts1, Ts2, Ts3 and Bs.

Since they are logic signals, the amplitudes of the signals upstream of the adapter 80 are equal, about 3.4 volts in the embodiment described.

According to curves 4d, 4f and 4h, it is noted that the transistor 90, at each recurrence period, is "off" at the beginning of this period for a time duration proportional to $\sin \theta$, and that it is "on" during the rest of this period, delivering the reference signal 0. It is further noted that the transistor 91 is "off" for the whole of this recurrence period. Transistor 92 is "on" at the beginning of this period for the same time duration proportional to $\sin \theta$ and provides the reference signal +R which is, in this case, the output signal Bs, and is "off" during the rest of this period.

A rectangular periodic output signal Bs is therefore obtained. This signal is modulated in time duration as a function of the signal Qs, and therefore of the absolute value of $\sin \theta$, and of the sign of $\sin \theta$.

FIG. 5 shows the curves similar to those of FIG. 2 and particularly the output signal Bc, corresponding to the cosine channel, with the assumption that the sign of $\cos \theta$ is negative, i.e. the computer 1 supplies a zero sign signal, corresponding to bit 0, which is applied to the input of the inverter 72.

The two signals Bs (FIG. 4i) and Bc (FIG. 5i) are respectively applied to one of the inputs of two differential amplifiers 120 and 130. The output signals from these amplifiers are respectively applied to the two stator windings 121 and 131, having their axes at right angle, of a conventional compensated electromagnetic resolver 140, also called counter-reaction resolver. Thus, the resolver 140 comprises, near each stator winding 121 and 131 respectively, two compensation windings or counter-reaction windings 121 and 132. The voltages across these windings are applied to the other of the inputs of the two amplifiers 120 and 130, respectively, via two capacitors 123 and 133, the capacitances of which are larger with respect to the impedances of the windings of the resolver.

The rotor 150 of the resolver 140 is conventionally inserted in an angular servo-control loop 160, comprising a servomotor 180 and an amplifier 170 for supplying the motor 180 from the voltage induced in the rotor 150 by the two stators 121 and 131. The motor 180 controls the rotation of the rotor 150, possibly via a reduction gear (not shown), by orienting it by the desired angle $\theta$ with respect to a predetermined reference axis. In this way the voltage induced on the rotor 150, and which therefore controls the motor 180 via the amplifier 170, is zero and the rotor 150 is found in position of balance.

The invention is particularly noteworthy in that the amplifier 170 supplying the motor 180 must receive the voltage issuing from the rotor 150 only when the signals Bs and Bc are zero simultaneously, i.e. outside the countdown periods of the two counters 10 and 20, or outside the periods when the output signals Qs and Qc of the flip-flops 30 and 40 are simultaneously in their low state. Applicants have thus observed by experimentation that, when this is not the case, it is impossible to attain the desired result.

To this end, the device of the invention comprises a NAND gate 190, a supplementary inverter 200 and a solid state commutator 210.

The truth table of a NAND gate is as follows:

| input 1 | input 2 | output |
|---------|---------|--------|
| 0 | 0 | 1 |
| 0 | 1 | 1 |
| 1 | 0 | 1 |
| 1 | 1 | 1 |

The commutator 210 is constituted by two field effect transistors, one transistor 211 connected to the rotor 150 of the resolver 140 and one transistor 212 connected to ground (0 V), the two transistors being connected, on the other hand, to the input of the servocontrol amplifier 170.

One of the inputs of the NAND gate 190 is connected to the output of the flip-flop 30 to receive the signal Qs, the other input being connected to the output of the flip-flop 40 to receive the signal Qc. The gate 190 delivers an output signal to directly supply the control electrode of transistor 212 and, via the inverter 200, the control electrode of the transistor 211.

Figure 6:
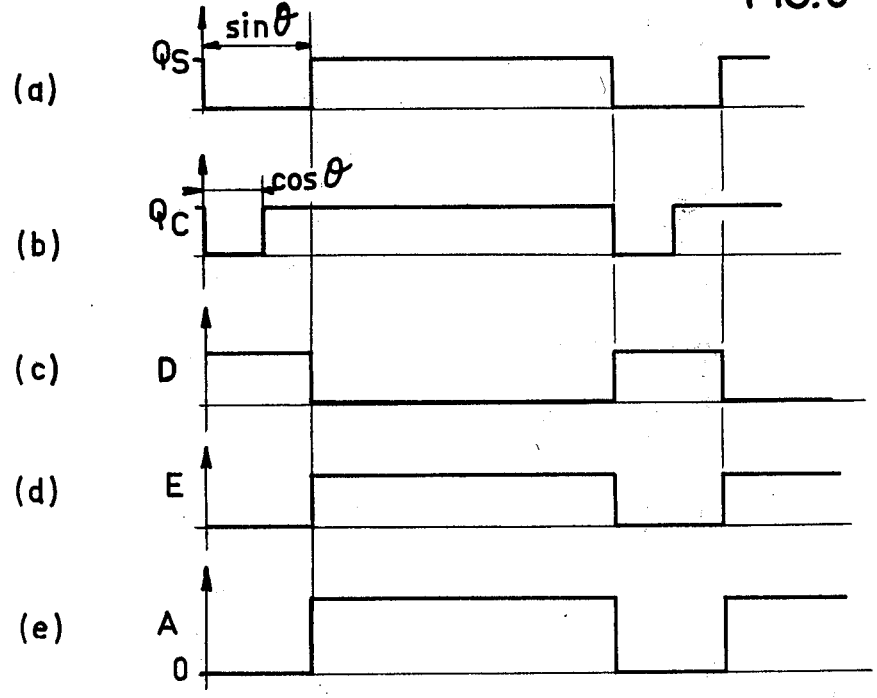

As a function of signals Qs and Qc already described, and shown in FIG. 6, this Figure also shows the output signal D of the NAND gate 190, the output signal E of the inverter 200 and the signal A at the output of the commutator 210, which is in fact the voltage induced on the rotor 150 of the resolver 140.

Thus, when one or both of the two signals Qs and Qc is in its low state, the transistors 211, called the control transistor, is "off" (FIG. 6d) and transistor 212, called the inhibition transistor, is "on" (FIG. 6c), thus connecting the input of amplifier 170 to ground. When the two signals Qs and Qc are simultaneously in their high state, the transistor 212 is "off" (FIG. 6c) and transistor 211 is "on" (FIG. 6d), thus commutating the input of the amplifier 170 to the output of the rotor 150 of the resolver 140.

What is claimed is:

1. In a device for converting into analog form a digital information constituted by four binary numbers representing absolute values and polarities of the sine and cosine trigonometric components of a variable angle, particularly on an air navigation computer of the type embarked on board an aircraft, comprising means for generating calibrated D.C. voltages, analog switches for converting said D.C. voltages into periodic rectangular signals of equal amplitudes, means responsive respectively to the polarities of the sine and cosine of said angle and controlling said switches, means responsive respectively to the absolute values of the sine and cosine of said angle and also controlling said switches, a conventional electro-magnetic counter-reaction resolver comprising a rotor winding and two stator windings to which are respectively applied said periodic rectangular signals via amplifiers, and an angular servo-control loop comprising another amplifier and said rotor winding, characterized in that said means respectively responsive to the absolute values of the sine and cosine of said angle modulate, for each value of said angle, the respective time durations of said periodic rectangular signals thus proportional to said absolute values, a solid state commutator is disposed between said other amplifier and said rotor winding, each of said amplifiers associated respectively with said stator windings of the resolver possesses a counter-reaction loop comprising a corresponding compensation winding of the resolver and a capacitor connected between said compensation winding and the corresponding amplifier, and means responsive to the output voltages of said means respectively responsive to the absolute values of the sine and cosine of said angle are provided to control said commutator, so as to connect said other amplifier and said rotor winding only in the simultaneous presence of said output voltages, i.e. only in the simultaneous absence of the output voltages of said analog switches.

2. The device of claim 1, wherein said analog switches comprise two sets of three field effect transistors to which said calibrated D.C. voltages are respectively applied.

3. The device of claim 1, wherein said means respectively responsive to the polarities of the sine and the cosine comprise two sets of first and second OR gates and first and second inverters, the output of said first inverter being connected to the input of said second inverter, the first input of said first OR gate being connected to the output of said second inverter, the second input of said first OR gate being connected to the first input of said second OR gate, and the second input of said second OR gate being connected to the output of said first inverter.

4. The device of claim 1, wherein said means respectively responsive to the absolute values of the sine and the cosine of said angle comprise two binary counters organised as countdown systems, a clock and a forcing means for controlling the counters.

5. The device of claim 1, wherein said solid state commutator, comprises two field effect transistors connected respectively to earth and to said rotor winding of the resolver.

6. The device of claim 1, wherein said solid state commutator comprises two field effect transistors connected respectively to earth and to said rotor winding of the resolver and said output voltages responsive means comprise a NAND gate and an inverter connected to the output of said NAND gate, the control electrode of the transistor connected to earth being connected to the output of said NAND gate, and the control electrode of the transistor connected to said rotor winding of the resolver being connected to the output of said inverter.

7. The device of claim 3, further comprising a NAND gate of which the two inputs are respectively connected to the second inputs of said first OR gates of said two respective sets of OR gates.

* * * * *